United States Patent
Lee et al.

(10) Patent No.: US 8,101,266 B2
(45) Date of Patent: Jan. 24, 2012

(54) MULTILAYER PRINTED CIRCUIT BOARD

(75) Inventors: Wen-Chin Lee, Taoyuan (TW); Cheng-Hsien Lin, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 898 days.

(21) Appl. No.: 12/135,842

(22) Filed: Jun. 9, 2008

(65) Prior Publication Data

US 2009/0107706 A1  Apr. 30, 2009

(30) Foreign Application Priority Data

Oct. 31, 2007 (CN) .......................... 2007 1 0202336

(51) Int. Cl. *H01K 1/00* (2006.01)
(52) U.S. Cl. ........ 428/209; 428/901; 174/250; 174/255; 361/751
(58) Field of Classification Search .................. 428/209, 428/901; 174/250, 255; 361/751
See application file for complete search history.

(56) References Cited

U.S. PATENT DOCUMENTS

| 4,732,636 A * | 3/1988 | Varker ........................ 156/252 |
| 4,769,270 A * | 9/1988 | Nagamatsu et al. .......... 428/131 |
| 6,373,000 B2 * | 4/2002 | Nakamura et al. ............ 174/264 |
| 6,630,743 B2 * | 10/2003 | Magnuson et al. .......... 257/774 |

FOREIGN PATENT DOCUMENTS

| CN | 1355670 A | 6/2002 |
| CN | 1437435 A | 8/2003 |
| JP | H01-119096 A | 5/1989 |

* cited by examiner

Primary Examiner — Cathy Lam
(74) Attorney, Agent, or Firm — Altis Law Group, Inc.

(57) ABSTRACT

A multilayer printed circuit board includes a first printed circuit board, a second printed circuit board, an adhesive film, and a function layer. The adhesive film is sandwiched between the first printed circuit board and the second printed circuit board. The function layer is disposed between the first printed circuit board and the second printed circuit board for blocking water from passing therethrough and for screening electromagnetic interference between the first printed circuit board and the second printed circuit board.

14 Claims, 5 Drawing Sheets

MULTILAYER PRINTED CIRCUIT BOARD

BACKGROUND OF THE INVENTION

1. Field of the Invention

The present invention relates to flexible printed circuit boards (FPCBs) and, particularly, to a multilayer printed circuit board having electromagnetism screen and waterproof performance.

2. Description of Related Art

With the development of integration of portable electronic devices, multilayer printed circuit boards have been widely used to maintain an electrical connection between a number of components in portable electronic devices.

The multilayer printed circuit board is composed of two or more single-layer printed circuit boards and one or more adhesive layer disposed between the adjacent single-layer printed circuit boards. The multilayer printed circuit board can be manufactured by laminating the two or more single-layer printed circuit boards together with one or more adhesive layer disposed between adjacent single-layer printed circuit boards. After the two or more single-layered printed circuits and one or more adhesive layer are laminated together, two opposite outmost electrical traces are formed using a series of wetting processes, such as cleaning, developing, etching, electro-plating, etc. In the multilayer printed circuit board, each single-layer printed circuit board is composed of an insulation film and a copper film formed on the insulation film. Regarding an outmost single-layer printed circuit board of the multilayer printed circuit board, the copper film of the outmost printed circuit board is required to be made into the outmost electrical trace.

For example, a process for manufacturing the outmost electrical trace of the FPCB includes the following steps. Firstly, the copper film is cleaned in a cleaning solution to remove surface oils of the copper film. Secondly, a photo-resist layer is formed on the surface of the copper film. Thirdly, the photo-resist layer is exposed to light beams using a mask having a predetermined pattern. Thus, one portion of photo-resist layer is covered by the mask, and the other portion of photo-resist layer is not covered and irradiated by the light beams. When the photo-resist layer is made of a positive photo-resist, the uncovered photo-resist layer (i.e. the exposed photo-resist layer) is soluble in a developing agent. Fourthly, the copper film having the photo-resist layer is developed in the developing agent. During the developing process, the exposed photo-resist layer is dissolved in the developing agent, and the residual photo-resist layer forms a patterned photo-resist layer. Thus, one portion of the copper film is covered by the pattered photo-resist layer, and the other portion of the copper film is exposed to the outside. Fifthly, the copper film not covered by the photo-resist layer is dissolved by an etching solution. As a result, the residual copper film covered by the photo-resist layer forms a copper trace. Finally, the photo-resist layer covering the copper trace is eliminated, thereby obtaining the desired outmost electrical trace of the multilayer printed circuit board.

In the above mentioned process, the multilayer printed circuit board is exposed in liquid solutions (e.g., the cleaning solution, the developing agent, the etching solution) repeatedly, and the liquid solution may inevitably penetrate into the multilayer printed circuit board. In other words, molecules (e.g., water molecules) or other ions of the liquid solution may migrate between adjacent electrical traces in adjacent single-layer printed circuit boards. That is, an ion migration phenomena may occur between adjacent electrical traces in adjacent single-layer printed circuit boards. As a result, the molecules (e.g., water molecules) or other ions may react with or electrical connect the adjacent electrical traces, as a result, a quality of the electrical traces may be affected, e.g., causing an open circuit phenomena or a short circuit phenomena.

What is need, therefore, is a multilayer printed circuit board which can overcome the above-described problems.

SUMMARY OF THE INVENTION

An embodiment of a multilayer printed circuit board includes a first printed circuit board, a second printed circuit board, an adhesive film, and a function layer having electromagnetism screen and waterproof performance. The adhesive film is sandwiched between the first printed circuit board and the second printed circuit board. The function layer is disposed between the first printed circuit board and the second printed circuit board for blocking water from passing therethrough and for screening electromagnetic interference between the first printed circuit board and the second printed circuit board.

Advantages and novel features will become more apparent from the following detailed description when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Embodiments will now be described in detail below and with reference to the drawings.

Figure 1:
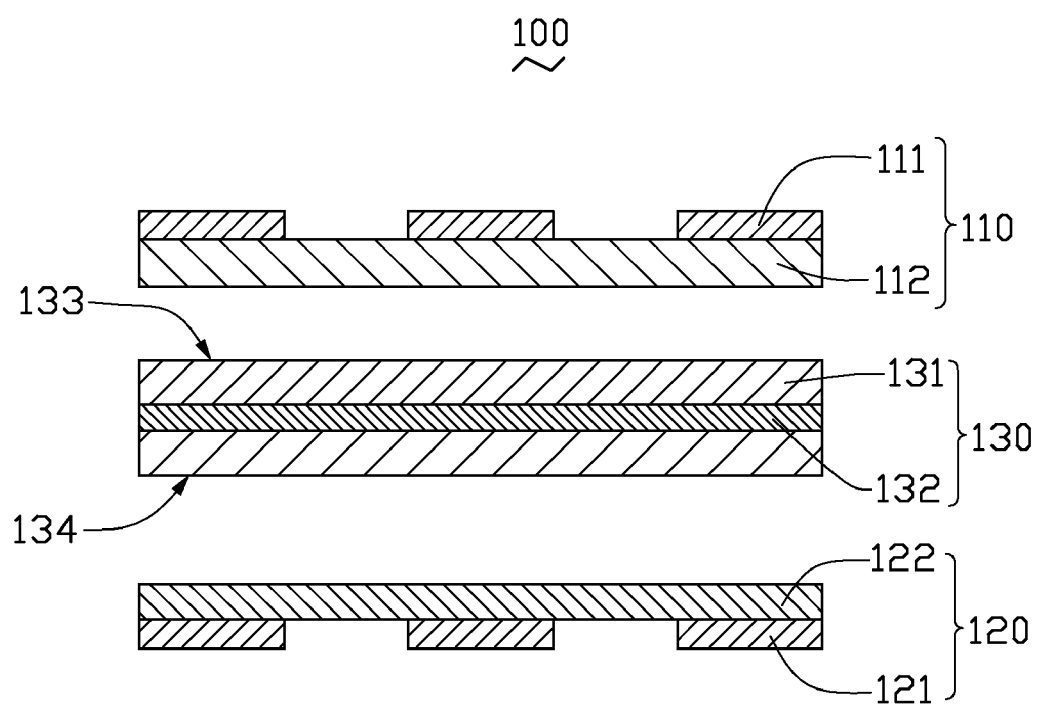
FIG. 1 is a schematic, exploded view of a multilayer printed circuit board before laminating, in accordance with a first embodiment.
Figure 2:
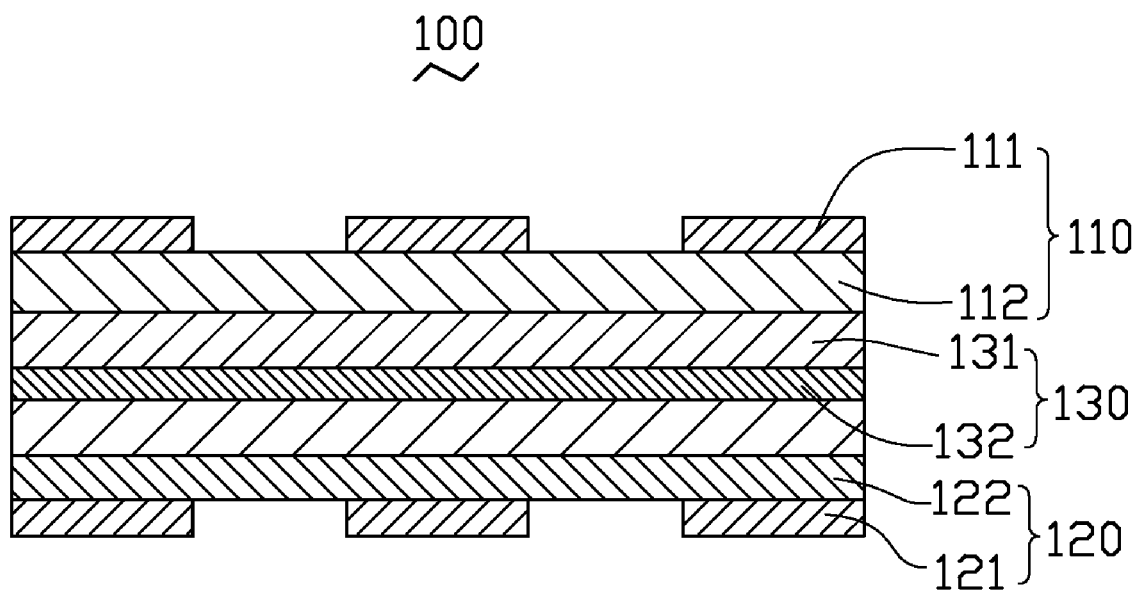
FIG. 2 is a schematic view of the multilayer printed circuit board after being laminated of the first embodiment.

Referring to FIG. 1 and FIG. 2, a multilayer printed circuit board 100, in accordance with a first preferred embodiment, is shown. The multilayer printed circuit board 100 includes two or more electrical traces, and may be composed of two or more single-layer printed circuit boards. In the present embodiment, the multilayer printed circuit board 100 includes a first printed circuit board 110, a second printed circuit board 120, and an adhesive film 130 sandwiched between the first and second printed circuit boards 110, 120. The first printed circuit board 110 includes a first insulation layer 112 and a first electrical trace 111 formed on the first insulation layer 112. The second printed circuit board 120 includes a second insulation 122 and a second electrical trace 121 formed on the second insulation layer 122.

The adhesive film 130 includes an adhesive matrix 131 and a functional layer 132 having electromagnetism screen and waterproof performance (hereinafter called functional layer 132). The function layer 132 is made of materials having electromagnetism screen and waterproof performance such as an aluminum foil. The adhesive matrix 131 includes a first surface 133 and a second surface 134 on opposite side of the first surface 133. It is noted that the function layer 132 is configured for screening the electromagnetism interference occurring between the first electrical trace 111 and the second electrical trace 121. Therefore, configuration and position of the function layer 132 in the adhesive matrix 131 are not limited, as long as the function layer 132 can isolate/screen the first electrical trace 111 and the second electrical trace 121 in the thicknesswise direction of the adhesive matrix 131.

For example, the function layer 132 is disposed between the adhesive film 130 and the first insulation layer 112, or between the adhesive film 130 and the second insulation layer 122. Specifically, the function layer 132 is disposed between the first surface 133 and the first insulation layer 112, or between the second surface 134 and the second insulation layer 122. In the circumstance, the function layer 132 is usefully configured to be a flat structure, thereby facilitating the first printed circuit board 110, the second printed circuit board 120 and the adhesive layer 130 combining with each other.

Alternatively, the function layer 132 can be disposed in the adhesive matrix 131, that is, disposed between the first surface 133 and the second surface 134. In the circumstance, the function layer 132 can be configured to be a flat structure or a curve structure. In the present embodiment, the first and second surfaces 133, 134 of the function layer 132 are flat surfaces, and the function layer 132 is disposed between and parallel with the first and second surfaces 133, 134, thereby the first electrical trace 111 and the second electrical trace 121 are isolated in a thicknesswise of the adhesive matrix 131 by the function layer 132. When the multilayer printed circuit board 100 is in a working state, electrical signals generated in the first and second electrical traces 111, 121 are screened by the function layer 132, thereby avoiding the electromagnetism screen phenomena and improving a quality of work of the multilayer printed circuit board 100.

A thickness of the function layer 132 is in a range from about 3 micrometers to about 25 micrometers. In other words, when the function layer 132 is a flat structure, the thickness is in a range from about 3 micrometers to about 25 micrometers. When the function layer 132 is a curve structure, an average thickness is in a range from about 3 micrometers to about 25 micrometers. Furthermore, in practical application, the thickness of the function layer 132 is based on thicknesses of the adhesive film 130, the first printed circuit board 110, and the second printed circuit board 120. For example, the thickness of the function layer 132 can be equal to or even above 3 mils (1 mil is equal to 25.4 micrometers).

Figure 3:
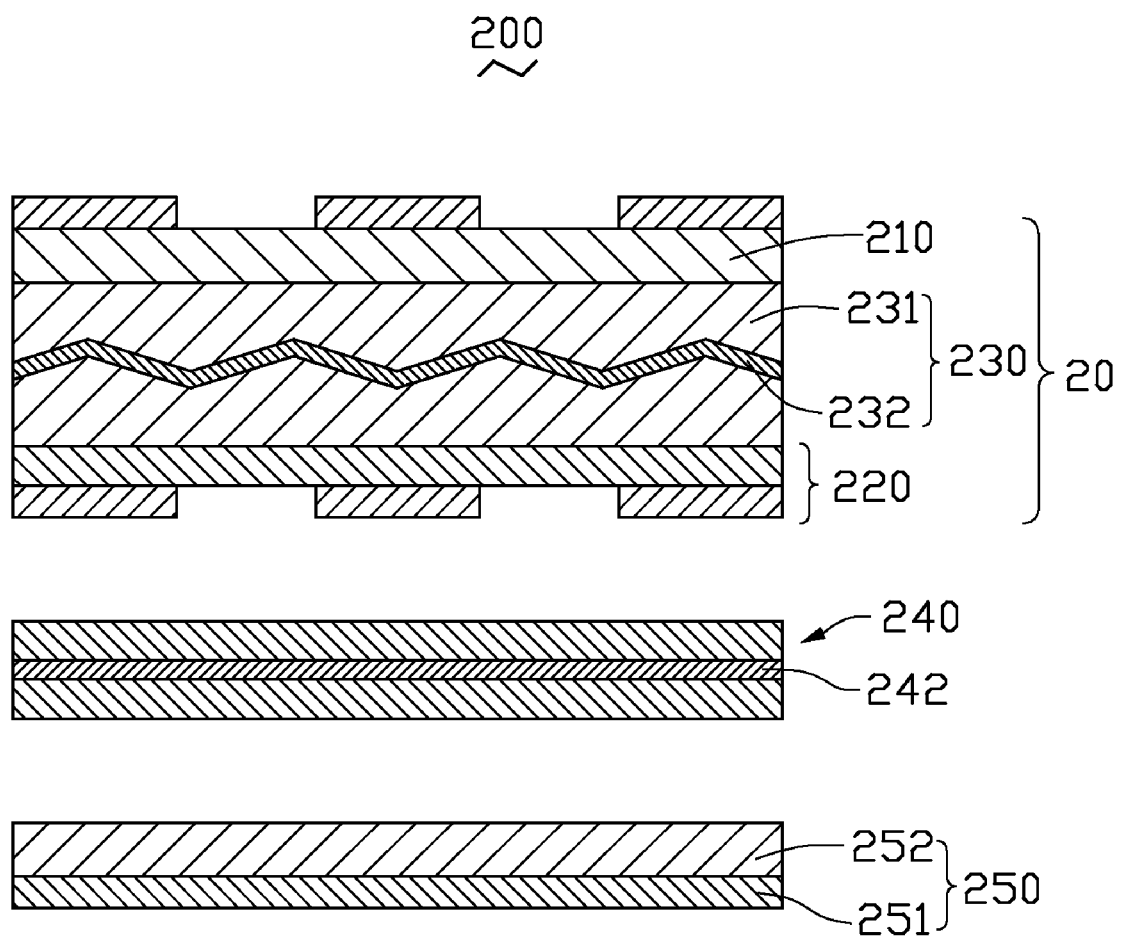
FIG. 3 is a schematic, exploded view of a multilayer printed circuit board before laminating, in accordance with a second embodiment.
Figure 4:
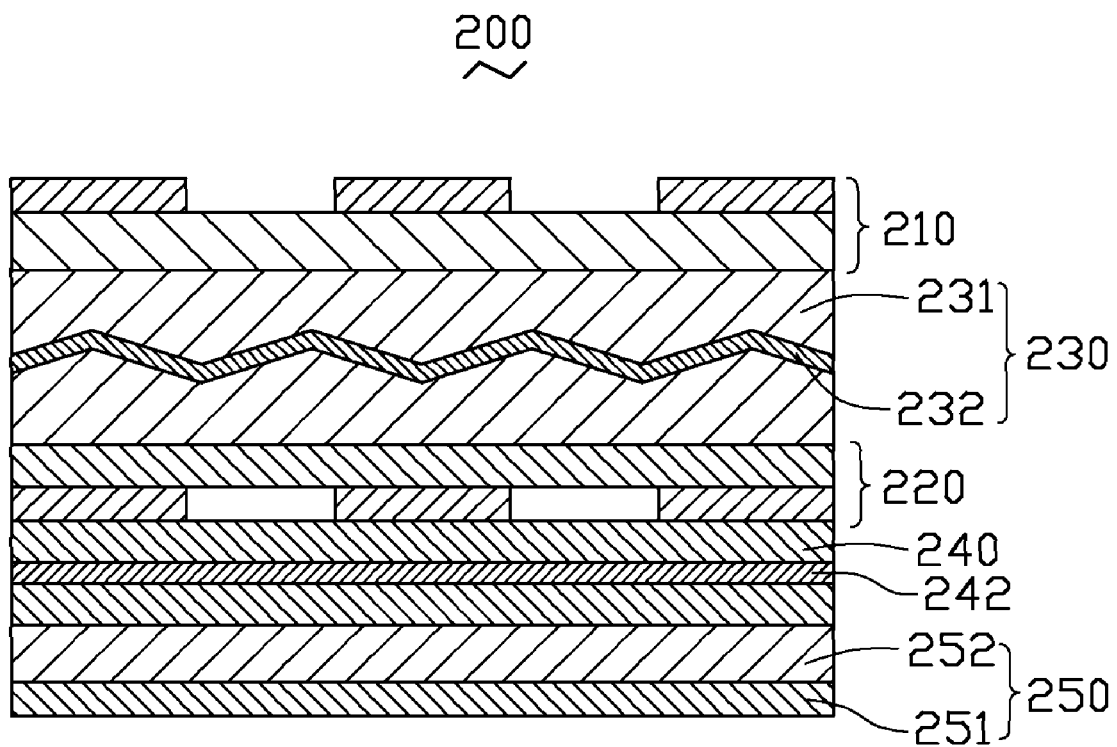
FIG. 4 is a schematic view of the multilayer printed circuit board after being laminated of the second embodiment.

Referring to FIG. 3 and FIG. 4, a multilayer printed circuit board 200, in accordance with a second embodiment, is shown. The multilayer printed circuit board 200 is composed of a double-sided printed circuit board 20, a copper clad laminate 250 and a second adhesive film 240 between the double-sided printed circuit board 20 and the copper clad laminate 250. The double-sided printed circuit board 20 includes a first printed circuit board 210, a first adhesive film 230 and a second printed circuit board 220. The double-sided printed circuit board 20 has a similar configuration with the multilayer printed circuit board 100 of the first embodiment, except for the first adhesive film 230. In the present embodiment, the first adhesive film 230 has a wavy first function layer 232 disposed therein. The second adhesive film 240 has an equal configuration with the multilayer printed circuit board 100 of the first embodiment. That is, a flat second function layer 242 is disposed in the second adhesive film 240. The copper clad laminate 250 includes a copper layer 251 and an insulation layer 252. The first and second function layers 232, 242 are comprised of aluminum material, for example, an aluminum foil.

With respect to the multilayer printed circuit board 200, the second function layer 242 electromagnetically screens/shields/isolates the double-sided printed circuit board 20 and the copper clad laminate 250 along a thickness of the multilayer printed circuit board 200. In detail, when the copper layer 251 is made into a copper trace, the second function layer 242 can electromagnetically screen/shield/isolate traces on the second printed circuit board 220 and the copper trace made of the copper layer 251. In addition, when the copper layer 251 is made into the copper trace using an etching method, the multilayer printed circuit board 200 is required to be immerged in an etchant, the first and second function layers 232, 242 can prevent molecules (e.g., water molecules) or other ions of in the etchant migrating between the first printed circuit board 210, the second printed circuit board 220 and the copper clad laminate 250. In other words, the first and second function layers 232, 242 can prevent the ion migration phenomena occurring between adjacent traces of the multilayer printed circuit board 200.

It is understood that the multilayer printed circuit board 200 can be a flexible printed circuit board, a rigid printed circuit board, or a flexible-rigid printed circuit board. In these multilayer printed circuit boards, at least one function layer is disposed between the multilayer traces, e.g., two or more function layers are disposed among three or more traces, to electromagnetically screen/shield/isolate the multilayer traces.

Figure 5:
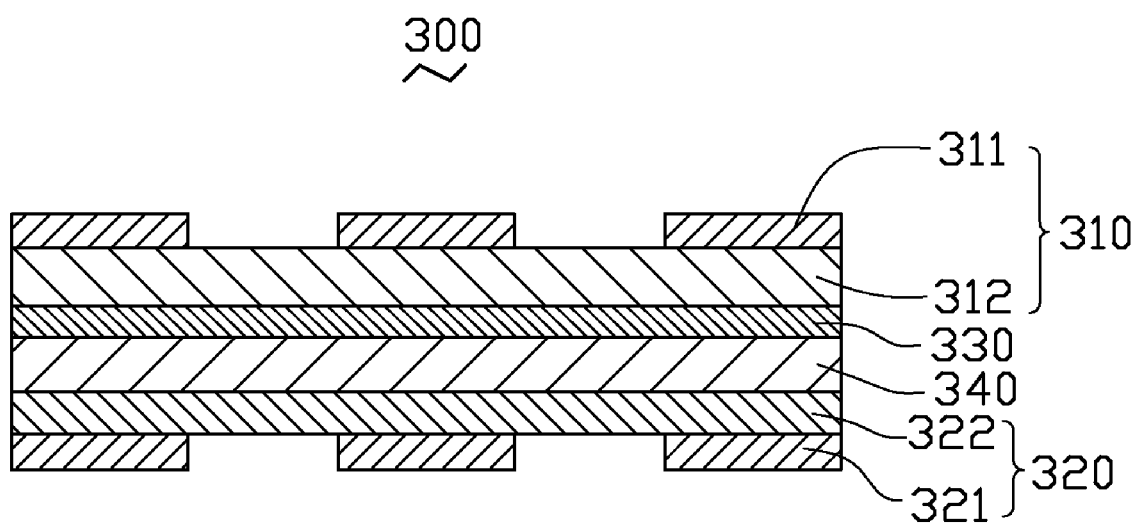
FIG. 5 is a schematic view of the multilayer printed circuit board in accordance with a third embodiment.

Referring to FIG. 5, a multilayer printed circuit board 300, in accordance with a third embodiment, is shown. The multilayer printed circuit board 300 includes a first printed circuit board 310, a second printed circuit board 320, a function layer 330, and an adhesive film 340. The function layer 330 is disposed between an interface between the first printed circuit boards 310 and the adhesive film 340. Specifically, the first printed circuit board 310 includes a first insulation layer 312 and a first electrical trace 311 formed on the first insulation layer 312. The second printed circuit board 320 includes a second insulation 322 and a second electrical trace 321 formed on the second insulation layer 322. The function layer 330 is sandwiched between the first insulation layer 312 and the adhesive film 340.

Advantageously, the multilayer printed circuit board is manufactured using a laminating method. Taking the multilayer printed circuit board 100 as an example, in case of the function layer 132 exists in the adhesive matrix 131, the method of laminating the multilayer printed circuit board 100 includes the following steps. Firstly, the function layer 132 is disposed in the adhesive matrix 131 to form the adhesive film 130. Secondly, the adhesive film 130 is disposed between the first printed circuit board 110 and the second printed circuit board 120. Finally, the first printed circuit board 110, the adhesive film 130 and the second printed circuit board 120 are laminated in the order written using a laminator, thereby obtaining the multilayer printed circuit board 100.

Furthermore, in case of the function layer 132 is disposed between the adhesive film 130 and the first printed circuit board 110, or between the adhesive film 130 and the second printed circuit board 120. In other words, the function layer 132 exists in an interface between first surface 133 of the adhesive film 130 and the first insulation layer 112 of the first printed circuit board 110, or exists an interface between the second surface 134 of the adhesive film 130 and the second insulation layer 122 of the second printed circuit board 120. For example, the function layer 132 exists in an interface between first surface 133 and the first insulation layer 112, the method of laminating the multilayer printed circuit board 100 includes the following steps. Firstly, the function layer 132 is disposed on the first surface 133 of the adhesive film 130. Secondly, the adhesive film 130 attached with the function layer 132 is disposed between the first printed circuit board 110 and the second printed circuit board 120. Finally, the first printed circuit board 110, the function layer 132, the adhesive film 130 and the second printed circuit board 120 are laminated in the order written using a laminator, thereby obtaining the multilayer printed circuit board 100.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A multilayer printed circuit board, comprising:
   a first printed circuit board;
   a second printed circuit board; and
   an adhesive film sandwiched between the first printed circuit board and the second printed circuit board, the adhesive film comprising a first surface and a second surface at an opposite side to the first surface; and
   a function layer disposed between the first printed circuit board and the second printed circuit board and between the first surface and the second surface, the function layer configured for blocking water from passing therethrough and for screening electromagnetic interference between the first printed circuit board and the second printed circuit board.

2. The multilayer printed circuit board as claimed in claim 1, wherein the function layer is an aluminum foil.

3. The multilayer printed circuit board as claimed in claim 1, wherein the function layer is substantially flat and is parallel to the first surface and the second surface of the adhesive film.

4. The multilayer printed circuit board as claimed in claim 3, wherein a thickness of the function layer is in a range from about 3 micrometers to about 25 micrometers.

5. The multilayer printed circuit board as claimed in claim 1, wherein the function layer is wave-shaped, and is, as a whole, substantially parallel to the first surface and the second surface.

6. The multilayer printed circuit board as claimed in claim 5, wherein an average thickness of the function layer is in a range from about 3 micrometers to about 25 micrometers.

7. The multilayer printed circuit board as claimed in claim 1, wherein the function layer is disposed between the first printed circuit board and the adhesive film.

8. A multilayer printed circuit board, comprising:
   a first printed circuit board comprising a first insulation layer and a first electrical trace formed on the first insulation layer;
   a second printed circuit board comprising a second insulation layer and a second electrical trace formed on the second insulation layer; and
   an adhesive film sandwiched between the first insulation layer of the first printed circuit board and the second insulation layer of the second printed circuit board, the adhesive film comprising an adhesive matrix and a function layer, the adhesive film comprising a first surface and a second surface at an opposite side to the first surface, the function layer disposed between the first surface and the second surface, the function layer being configured for screening electromagnetic interference between the first electrical trace and the second electrical trace.

9. The multilayer printed circuit board as claimed in claim 8, wherein the function layer comprises an aluminum foil.

10. The multilayer printed circuit board as claimed in claim 8, wherein the function layer is substantially flat and is parallel to the first surface and the second surface.

11. The multilayer printed circuit board as claimed in claim 10, wherein a thickness of the function layer is in a range from about 3 micrometers to about 25 micrometers.

12. The multilayer printed circuit board as claimed in claim 8, wherein the function layer is wave-shaped, and is, as a whole, substantially parallel to the first surface and the second surface.

13. The multilayer printed circuit board as claimed in claim 12, wherein an average thickness of the function layer is in a range from about 3 micrometers to about 25 micrometers.

14. A multilayer printed circuit board, comprising:
   a first printed circuit board comprising a first insulation layer and a first electrical trace formed on the first insulation layer;
   a second printed circuit board comprising a second insulation layer and a second electrical trace formed on the second insulation layer;
   a first adhesive film sandwiched between the first insulation layer and the second insulation layer, the first adhesive film comprising a first surface and a second surface at an opposite side to the first surface;
   a first function layer disposed between the first surface and the second surface for screening electromagnetic interference between the first electrical trace and the second electrical trace;
   a copper clad laminate comprising a third insulation layer and a copper trace formed on the third insulation layer;
   a second adhesive film sandwiched between the second electrical trace and the third insulation layer, the second adhesive film comprising a third surface and a fourth surface at an opposite side to the third surface; and
   a second function layer disposed between the third surface and the fourth surface for screening electromagnetic interference between the second electrical trace and the copper trace.

* * * * *